(12) United States Patent
Lin et al.

(10) Patent No.: US 8,622,360 B2
(45) Date of Patent: Jan. 7, 2014

(54) MOUNTING APPARATUS FOR DATA STORAGE DEVICE

(75) Inventors: Chih-Min Lin, New Taipei (TW); Wen-Chen Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 167 days.

(21) Appl. No.: 13/310,810

(22) Filed: Dec. 5, 2011

(65) Prior Publication Data
US 2013/0099082 A1   Apr. 25, 2013

(30) Foreign Application Priority Data
Oct. 24, 2011   (TW) .............................. 100138505 U

(51) Int. Cl.
*A47F 5/00*   (2006.01)
(52) U.S. Cl.
USPC ............... 248/316.8; 248/244.8; 361/679.33; 361/679.37; 361/725; 361/807; 361/810
(58) Field of Classification Search
USPC .................. 248/224.8, 316.8, 560, 636; 361/679.02, 679.31, 679.33, 679.34, 361/679.36, 725, 752, 796, 679.37, 807, 361/810
See application file for complete search history.

(56) References Cited

U.S. PATENT DOCUMENTS

| | | | |
|---|---|---|---|
| 5,317,483 A * | 5/1994 | Swindler | 361/801 |
| 5,519,572 A * | 5/1996 | Luo | 361/679.23 |
| 6,317,329 B1 * | 11/2001 | Dowdy et al. | 361/725 |
| 6,480,391 B1 * | 11/2002 | Monson et al. | 361/752 |
| 6,937,467 B2 * | 8/2005 | Hsu | 361/679.41 |
| 8,413,945 B2 * | 4/2013 | Chen et al. | 248/500 |
| 8,498,104 B2 * | 7/2013 | Lin et al. | 361/679.31 |

* cited by examiner

*Primary Examiner* — Todd M Epps
(74) *Attorney, Agent, or Firm* — Altis Law Group, Inc.

(57) ABSTRACT

A mounting apparatus for mounting a number of data storage devices includes a supporting member, a connecting plate, and a number of partitioning members perpendicularly connected between the supporting member and the connecting plate. Each data storage device is sandwiched between two neighboring partitioning members. The supporting member defines a number of first latching holes. The connecting plate defines a number of second latching holes. Each partitioning member includes a partitioning plate, a first hook extending from a first end of the partitioning member, and a second hook extending out from a second end of the partitioning member. The first hook is detachably latched in the corresponding first latching hole. The second hook is detachably latched in the corresponding second latching hole.

14 Claims, 7 Drawing Sheets

MOUNTING APPARATUS FOR DATA STORAGE DEVICE

BACKGROUND

1. Technical Field

The present disclosure relates to an apparatus for mounting data storage devices.

2. Description of Related Art

Data storage devices, such as hard disk drives, are usually fixed in a frame of an electronic device, such as a server. Sandwiched between the hard disks is a plurality of partitioning plates. However, when one of the partitioning plates is unqualified or broken, the partitioning plate cannot be easily removed from the frame, thereby causing the frame to be discarded, which is wasteful and adds to cost.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
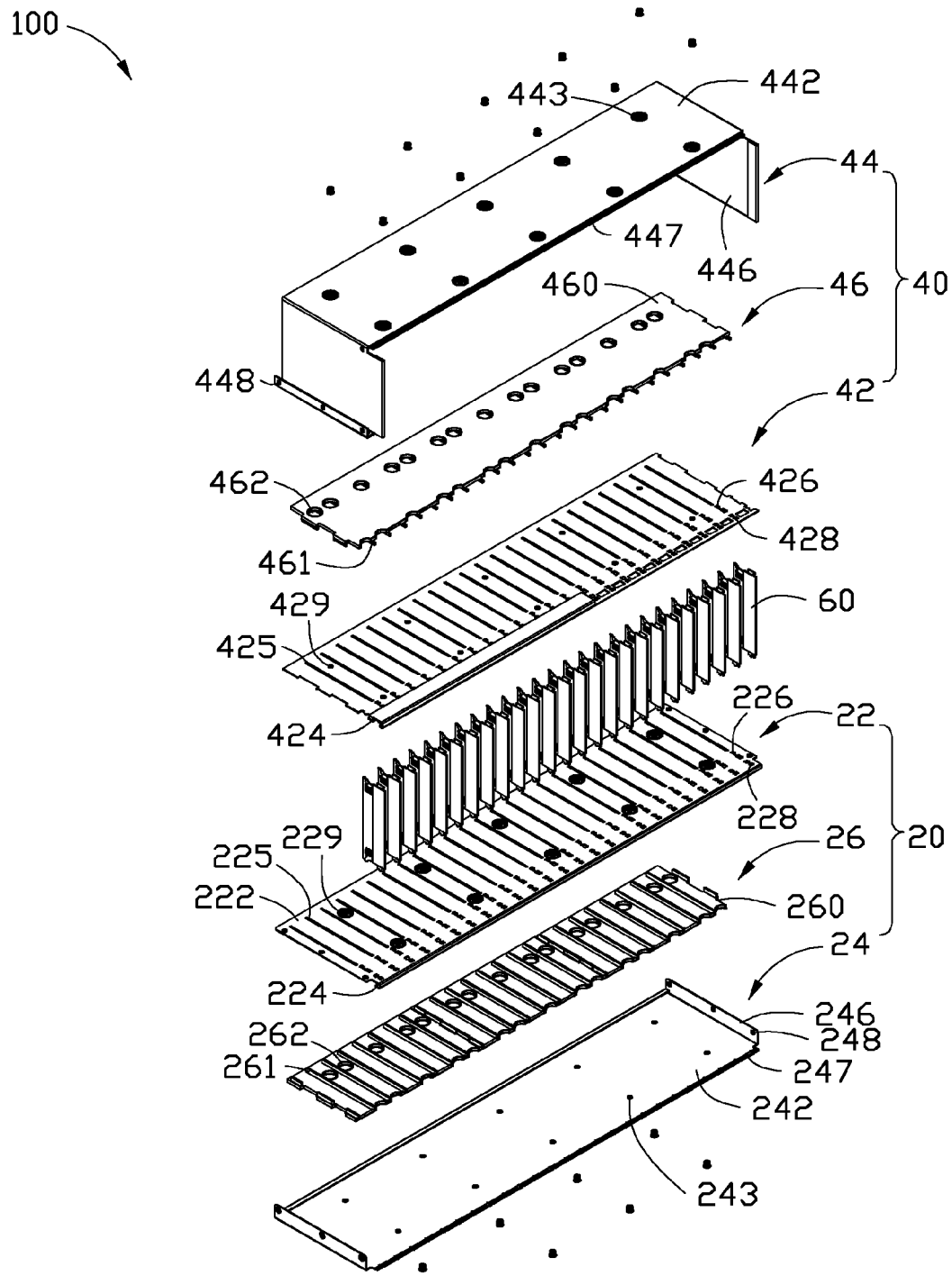
FIG. 1 is an exploded, isometric view of an embodiment of a mounting apparatus, wherein the mounting apparatus includes a plurality of partitioning members.
Figure 2:
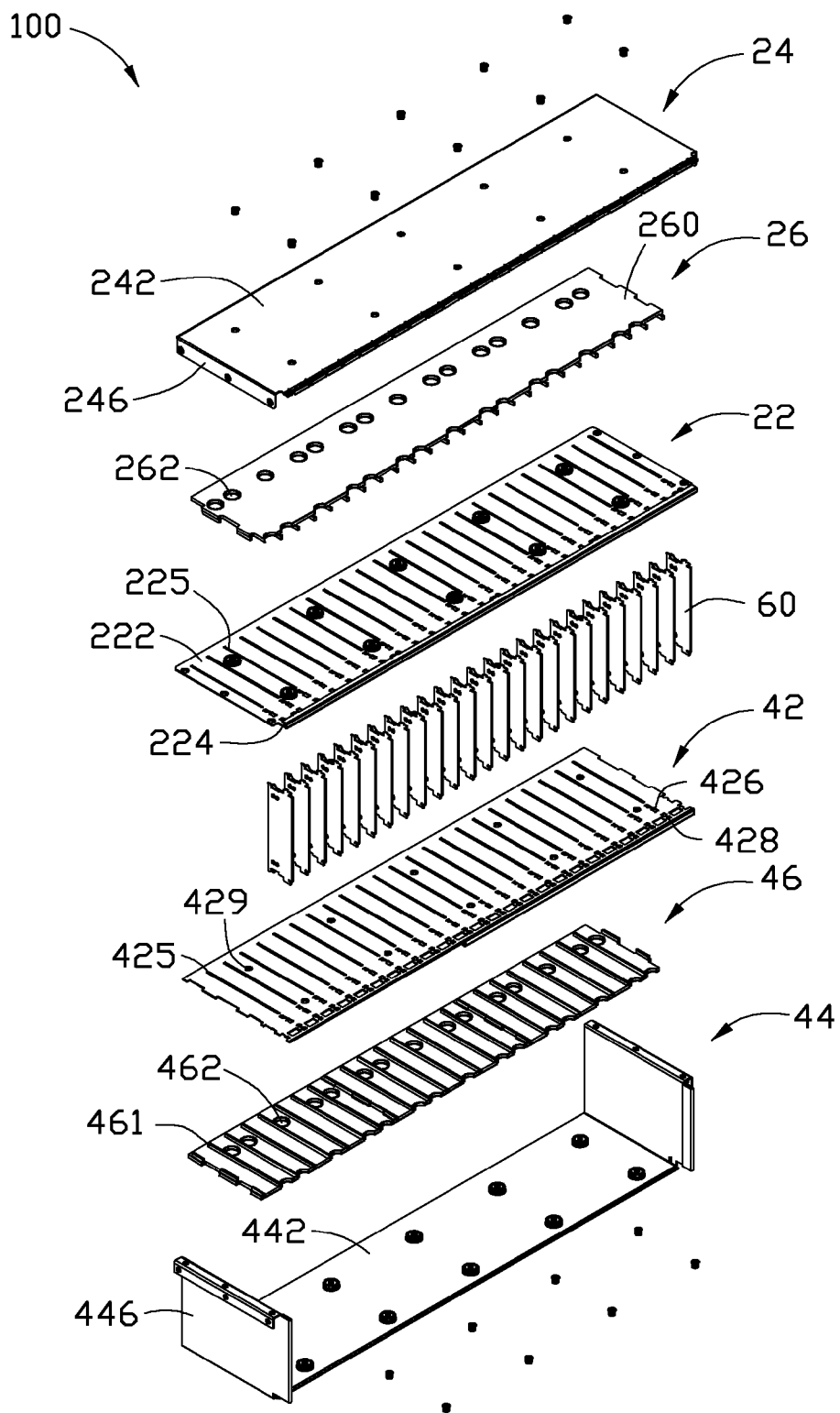
FIG. 2 is an inverted view of FIG. 1.
Figure 3:
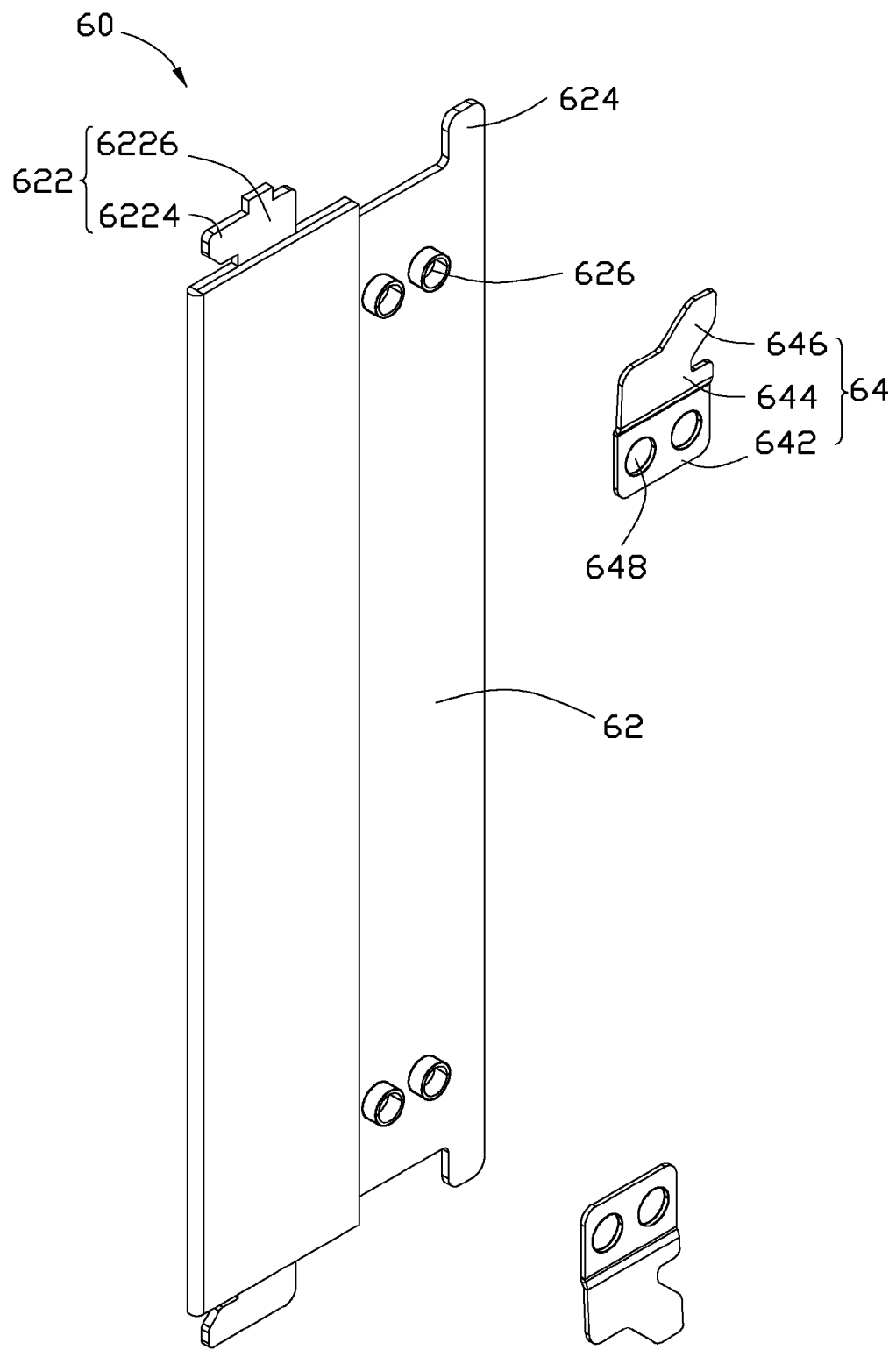
FIG. 3 is an exploded, isometric view of one of the partitioning members of FIG. 1.
Figure 4:
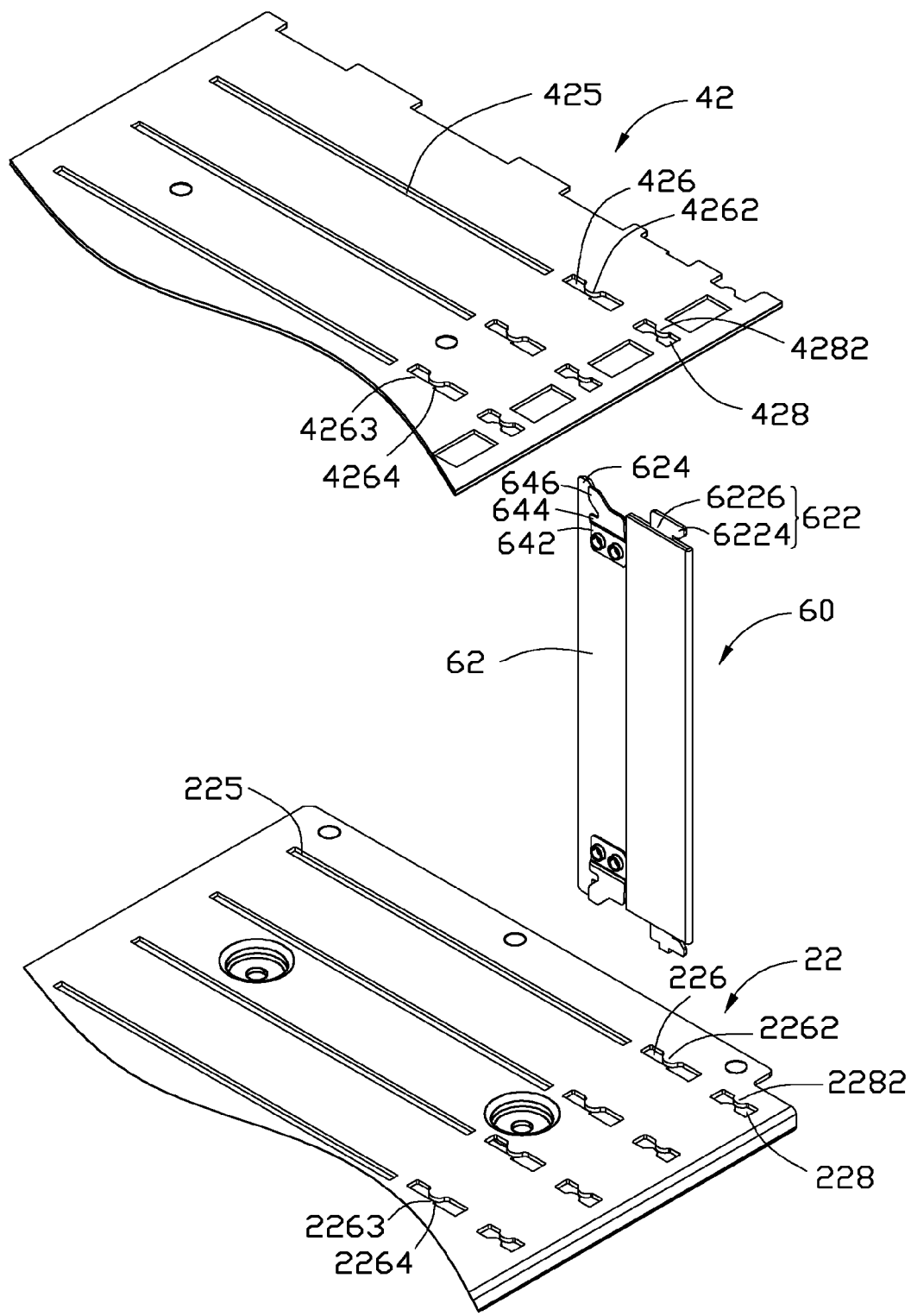
FIG. 4 is a partial, enlarged, isometric view of FIG. 1.

The disclosure, including the accompanying drawings, is illustrated by way of example and not by way of limitation. It should be noted that references to "an" or "one" embodiment in this disclosure are not necessarily to the same embodiment, and such references mean at least one.

Referring to FIGS. 1-4, an embodiment of a mounting apparatus 100 for mounting a plurality of data storage devices, such as hard disk drives. The mounting apparatus 100 includes a base 20, a cover 40, and a plurality of partitioning members 60 connected between the base 20 and the cover 40.

The base 20 includes a supporting member 22, a bottom shell 24, and a resilient first pad 26.

The supporting member 22 includes a rectangular supporting plate 222, and an L-shaped flange 224 first extending down from a front side of the supporting plate 222 then extending toward a rear side of the supporting plate 222. The supporting plate 222 defines a plurality of parallel slots 225 extending from the rear side toward the front side of the supporting plate 222, a plurality of first locating holes 226 respectively adjacent to front ends of the slots 225, a plurality of first latching holes 228 respectively between the flange 224 and the first locating holes 226, and a plurality of fastening holes 229.

A semicircular engaging block 2262 and a protrusion 2263 protrude into each first locating hole 226 from two opposite sidewalls bounding the first locating hole 226. The engaging block 2262 is located at a middle of the corresponding sidewall of each first locating hole 226, and the protrusion 2263 is located at a rear end of the first locating hole 226. A front end of the protrusion 2263 forms a latching surface 2264. Two semicircular engaging blocks 2282 protrude into each first latching hole 228 from two opposite sidewalls bounding the first latching hole 228.

The bottom shell 24 includes a rectangular bottom plate 242, two end plates 246 perpendicularly extending up from two opposite ends of the bottom plate 242, and an inserting plate 247 extending out from a front side of the bottom plate 242. The bottom plate 242 defines a plurality of through holes 243. Each end plate 246 defines a plurality of connecting holes 248.

The first pad 26 includes a substantially rectangular plate 260, and a plurality of parallel positioning pieces 261 protruding up from the plate 260 in a direction from a front side to a rear side of the plate 260. The plate 260 defines a plurality of through holes 262 between the positioning pieces 261.

In assembly of the base 20, the positioning pieces 261 are inserted into the corresponding slots 225 from the bottom of the supporting plate 222. The inserting plate 247 is inserted into the flange 224 from the bottom of the first pad 26. Screws extend through the corresponding through holes 243 and 262, to be screwed into the corresponding fastening holes 229.

The cover 40 includes a rectangular connecting plate 42, a top shell 44, and a resilient second pad 46.

The connecting plate 42 defines a plurality of parallel slots 425 extending from a rear side toward a front side of the connecting plate 42, a plurality of second locating holes 426 at front ends of the corresponding slots 425, a plurality of second latching holes 428 between the corresponding second locating holes 426 and the front side of the connecting plate 42, and a plurality of fastening holes 429 between the corresponding slots 425. A flange 424 first extends up from the front side of the connecting plate 42 then extends toward the rear side of the connecting plate 42.

A semicircular engaging block 4262 and a protrusion 4263 protrude into each second locating hole 426 from two opposite sidewalls bounding the second locating hole 426. A front end of the protrusion 4263 forms a latching surface 4264. The engaging block 4262 is located at a middle of the corresponding sidewall of each second locating hole 426, and the protrusion 4263 is located at a rear end of the second locating hole 426. Two semicircular engaging blocks 4282 protrude into each second latching hole 428 from two opposite sidewalls bounding the second latching hole 428.

The top shell 44 includes a rectangular top plate 442, two end plates 446 perpendicularly extending down from two opposite ends of the top plate 442, and an inserting plate 447 extending out from a front side of the top plate 442. The top plate 442 defines a plurality of through holes 443. Each end plate 446 defines a plurality of connecting holes 448.

The second pad 46 includes a substantially rectangular plate 460, and a plurality of parallel positioning pieces 461 protruding down from the plate 460 in a direction from a rear side to a front side of the plate 460. The plate 460 defines a plurality of through holes 462 between the positioning pieces 461.

In assembly of the cover 40, the positioning pieces 461 are inserted into the corresponding slots 425 from the top of the connecting plate 42. The inserting plate 447 is inserted into the flange 424. Screws extend through the through holes 443 and the through holes 462, to be screwed into the corresponding fastening holes 429.

Each partitioning member 60 includes a rectangular partitioning plate 62 and two resilient engaging pieces 64. Two substantially L-shaped hooks 622 respectively extend out from two opposite ends of the partitioning plate 62, adjacent to a first side of the partitioning plate 62. Two locating tabs 624 respectively extend out from the ends of the partitioning plate 62, adjacent to a second side of the partitioning plate 62 opposite to the first side. Two mounting holes 626 are defined in each end of the partitioning plate 62 between the corresponding hook 622 and the corresponding locating tab 624. Each hook 622 includes an extending piece 6226 extending out from the partitioning plate 62, and a latching block 6224 perpendicularly extending from the extending piece 6226 away from the corresponding locating tab 624.

Each engaging piece 64 includes a fixing plate 642, a connecting portion 644 extending from a side of the fixing plate 642, and an engaging portion 646 slantingly extending from an end of a side of the connecting portion 644 opposite to the fixing plate 642. The fixing plate 642 defines two fixing holes 648.

In assembly of each partitioning member 60, the fixing plate 642 of each engaging piece 64 is fixed to the partitioning plate 62, through four rivets extending through the corresponding fixing holes 648 and the corresponding mounting holes 626. Each engaging portion 646 is located between the corresponding hook 622 and the corresponding locating tab 624, and extends toward the locating tab 624.

Figure 5:
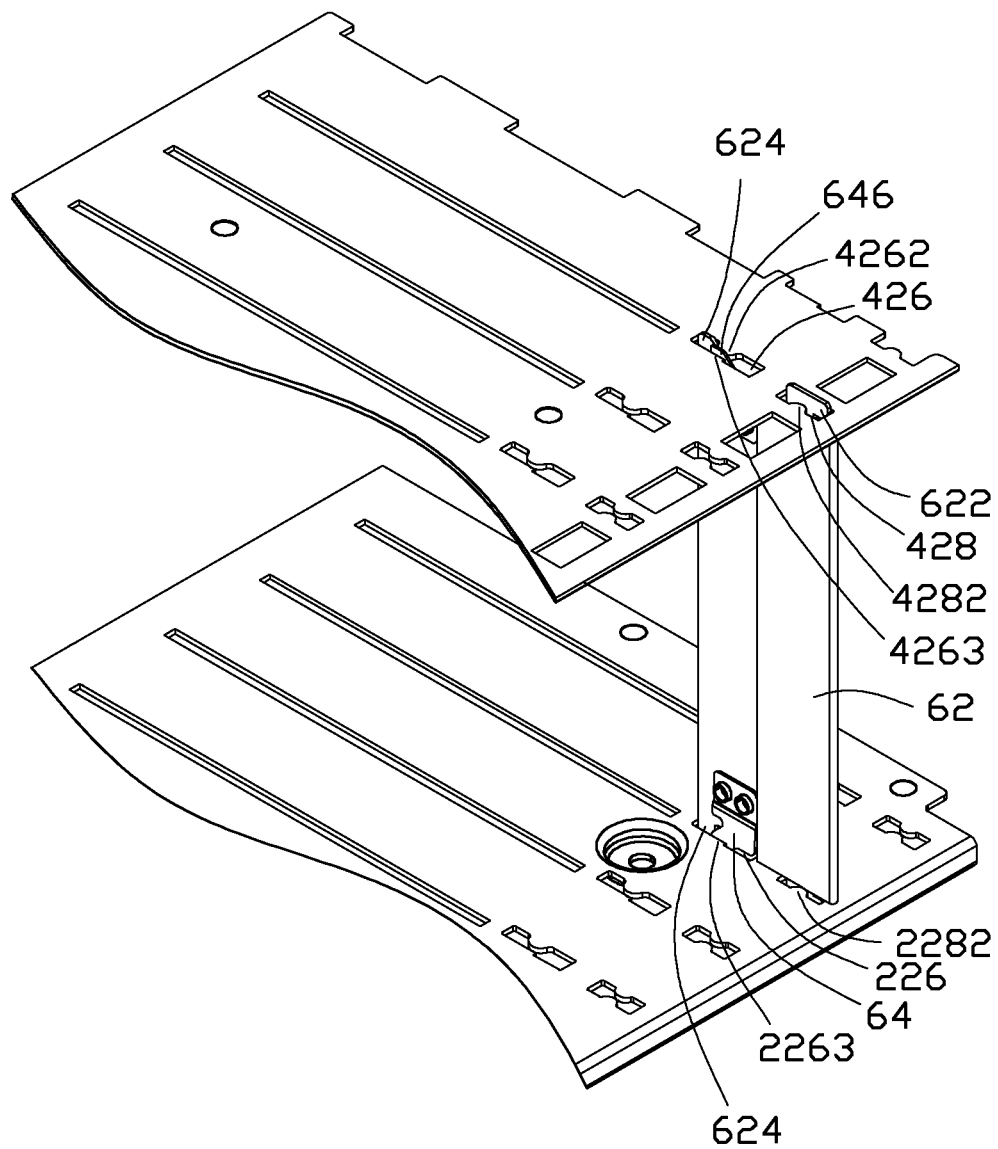
FIGS. 5-7 are isometric views of the process of assembling the mounting apparatus of FIG. 1.
Figure 6:
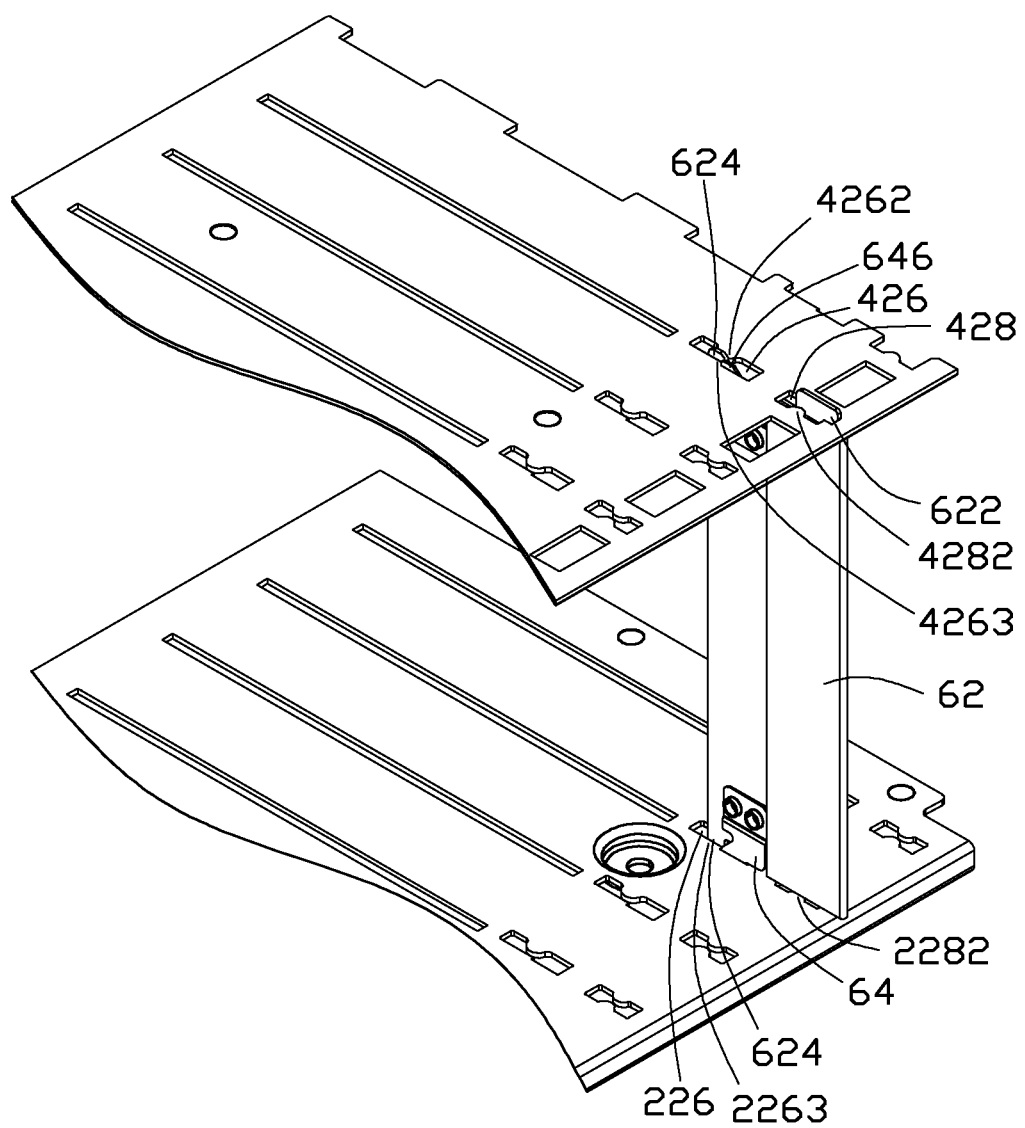
Figure 7:
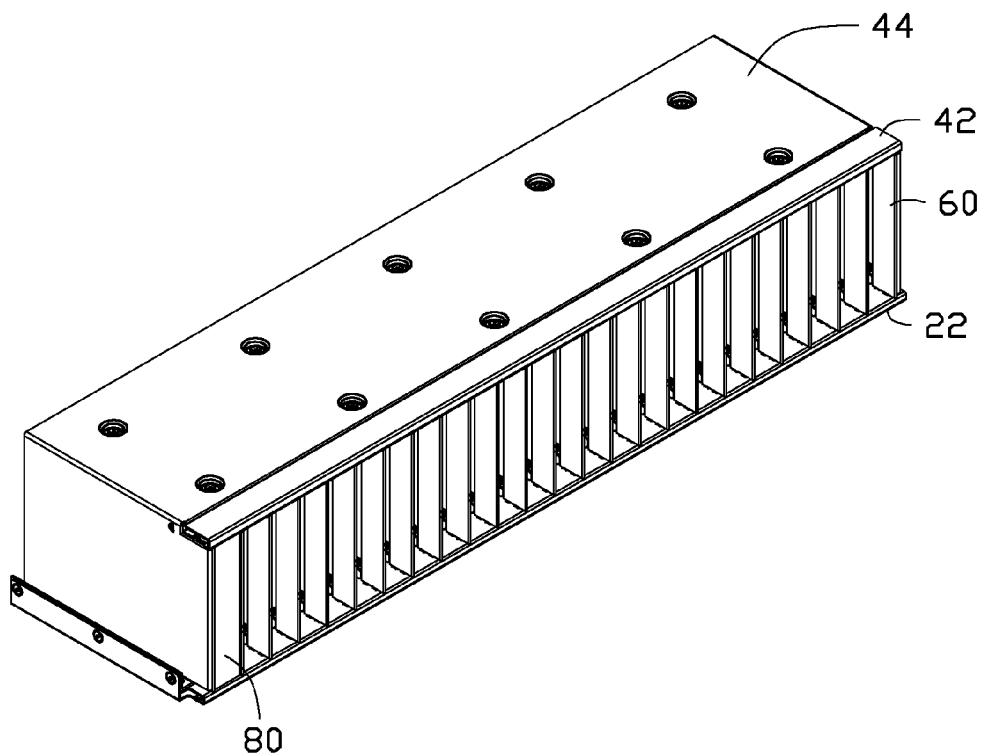

Referring to FIGS. 5-7, in assembly, the partitioning members 60 are perpendicularly attached between the supporting member 22 and the connecting plate 42. The hooks 622 are engaged in the corresponding first and second latching holes 228 and 428. The locating tabs 624 are engaged in the corresponding first and second locating holes 226 and 426. The partitioning members 60 are moved forward. The hooks 622 slide in the corresponding first latching holes 228 and the corresponding second latching holes 428, and the locating tabs 624 slide in the corresponding first locating holes 226 and the corresponding second locating holes 426, until the latching blocks 6224 latch to the front walls bounding the first and second latching holes 228 and 428. The extending pieces 6226 are sandwiched between the engaging blocks 2282 of the first latching holes 228 or second latching holes 428. The locating tabs 624 slide along inner surfaces of the corresponding protrusions 2263 or 4263 face the corresponding engaging blocks 2262 or 4262, and the engaging portions 646 slidably abut against the inner surfaces of the protrusion 2263 or 4263, thereby deforming the connecting portions 644 toward the partitioning plate 62. After the engaging portions 646 pass through the protrusions 2263 or 4263, the connecting portions 644 are restored to make the engaging portions 646 be blocked by the latching surfaces 2264 or 4264. The latching tabs 624 are sandwiched between the engaging blocks 2262 or 4262 and the protrusions 2263 or 4263. Therefore, the partitioning members 60 are detachably connected between the supporting member 22 and the connecting plate 42. A data storage device 80 can be accommodated between every two adjacent partitioning members 60.

The end plates 446 are abutted against inner surfaces of the corresponding end plates 246. Screws extend through the connecting holes 248, to be screwed into the corresponding connecting holes 448. The first and second pads 26 and 46 can absorb vibrations, to protect the data storage device 80.

When disassembling each partitioning member 60, the connecting portion 644 of each engaging piece 64 is deformed toward the corresponding partitioning plate 62, to disengage the engaging portions 646 from the latching surfaces 2264 and 4264. The partitioning member 60 is moved away from the flanges 224 and 424, to allow the hooks 622 to disengage from the supporting plate 222 and the connecting plate 42. Therefore, the partitioning member 60 may be easily separated from the base 20 and the cover 40.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A mounting apparatus for data storage devices, comprising:
    a base comprising a supporting member, the supporting member defining a plurality of first latching holes;
    a cover comprising a connecting plate, the connecting plate defining a plurality of second latching holes aligning with and corresponding to the first latching holes; and
    a plurality of partitioning members detachably connected between the supporting member and the connecting plate, two neighboring partitioning members of the plurality of partitioning members are operable to sandwich a data storage device, wherein each partitioning member comprises a partitioning plate with a first end and a second end opposite to the first end, a first hook extending out from the first end of the partitioning member, a second hook extending out from the second end of the partitioning member, a resilient first engaging piece mounted to the first end, and a resilient second engaging piece mounted to the second end, wherein the first hook is detachably latched in a corresponding one of the first latching holes, the second hook is detachably latched in a corresponding one of the second latching holes, the first engaging piece resiliently abuts against the supporting member, the second engaging piece resiliently abuts against the connecting plate.

2. The mounting apparatus of claim 1, wherein each first latching hole is defined in a front side of the supporting member, each first hook is slidably latched in the corresponding first latching hole, the supporting member further defines a plurality of locating holes adjacent to the first latching holes, the first engaging pieces extend through the corresponding locating holes and resiliently abut against sidewalls bounding a corresponding one of the locating holes.

3. The mounting apparatus of claim 2, wherein a locating tab extends out from the first end of the partitioning member, the first engaging piece is mounted between the locating tab and the first hook, a first engaging block and a protrusion protrude into each locating hole from two opposite sidewalls bounding the locating hole for sandwiching the locating tab.

4. The mounting apparatus of claim 3, wherein two second engaging blocks protrude into each first latching hole from two opposite sidewalls bounding the first latching hole, for sandwiching the first hook.

5. The mounting apparatus of claim 4, wherein each first hook comprises an extending piece extending out from the partitioning plate, and a latching block extending from the extending piece away from the locating tab, the extending piece is sandwiched between the second engaging blocks, the latching block latches a sidewall bounding the first latching hole.

6. The mounting apparatus of claim 3, wherein the first engaging piece comprises a fixing plate mounted to the partitioning plate, a resilient connecting portion extending from a side of the fixing plate, and an engaging portion slantingly extending from a side of the connecting portion away from the first hook, the protrusion forms a latching surface to block the engaging portion.

7. The mounting apparatus of claim 2, wherein the base further comprises a resilient pad mounted to the supporting member opposite to the partitioning members, the supporting member defines a plurality of parallel slots, a plurality of parallel positioning pieces protrude from the pad to engage in the corresponding slots.

8. The mounting apparatus of claim 1, wherein each second latching hole is defined in a front side of the connecting plate, each second hook is slidably latched in the corresponding second latching hole, the connecting plate further defines a plurality of locating holes adjacent to the second latching holes, the second engaging piece of each partitioning member extends through a corresponding one of the locating holes and resiliently abuts against a sidewall bounding the locating hole.

9. The mounting apparatus of claim 8, wherein a locating tab extends out from the second end of the partitioning member, the second engaging piece is mounted between the locating tab and the second hook, a first engaging block and a protrusion protrude into each locating hole from two opposite sidewalls bounding the locating hole for sandwiching the locating tab.

10. The mounting apparatus of claim 9, wherein two second engaging blocks protrude into each second latching hole from two opposite sidewalls bounding the second latching hole for sandwiching the second hook.

11. The mounting apparatus of claim 10, wherein each second hook comprises an extending piece extending out from the partitioning plate, and a latching block extending from the extending piece away from the locating tab, the extending piece is sandwiched between the second engaging blocks, the latching block latches a sidewall bounding the second latching hole.

12. The mounting apparatus of claim 8, wherein the second engaging piece comprises a fixing plate mounted to the partitioning plate, a resilient connecting portion extending out from a side of the fixing plate, and an engaging portion slantingly extending from a side of connecting portion away from the second hook, the protrusion forms a latching surface to block the engaging portion.

13. The mounting apparatus of claim 8, wherein the cover further comprises a resilient pad mounted to the connecting plate opposite to the partitioning members, the connecting plate defines a plurality of parallel slots, a plurality of parallel positioning pieces protrude from the pad to engage in the corresponding slots.

14. The mounting apparatus of claim 1, wherein the first and second engaging pieces are made of resilient material.

* * * * *